United States Patent
Kim et al.

(10) Patent No.: US 7,248,505 B2
(45) Date of Patent: Jul. 24, 2007

(54) FLASH MEMORY DEVICE

(75) Inventors: Myong-Jae Kim, Gyeonggi-do (KR); Doo-Sub Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 195 days.

(21) Appl. No.: 10/954,255

(22) Filed: Sep. 29, 2004

(65) Prior Publication Data
US 2005/0111264 A1 May 26, 2005

(30) Foreign Application Priority Data
Nov. 24, 2003 (KR) .................. 10-2003-0083553

(51) Int. Cl.
*G11C 16/04* (2006.01)
(52) U.S. Cl. .................. 365/185.33; 365/189.01
(58) Field of Classification Search ............ 365/185.33
See application file for complete search history.

(56) References Cited

U.S. PATENT DOCUMENTS

| | | | | |
|---|---|---|---|---|
| 5,521,863 A | * | 5/1996 | Kobayashi et al. | 365/185.12 |
| 5,535,166 A | * | 7/1996 | Bateman | 365/208 |
| 5,781,475 A | * | 7/1998 | Wang et al. | 365/185.18 |
| 6,134,153 A | * | 10/2000 | Lines et al. | 365/189.02 |
| 6,157,577 A | * | 12/2000 | McPartland | 365/189.05 |
| 6,288,952 B1 | * | 9/2001 | Zheng | 365/189.11 |
| 6,445,632 B2 | * | 9/2002 | Sakamoto | 365/205 |
| 6,614,691 B2 | * | 9/2003 | Roohparvar | 365/185.23 |
| 6,781,904 B2 | * | 8/2004 | Lee et al. | 365/207 |
| 6,879,524 B2 | * | 4/2005 | Monzel | 365/189.05 |
| 6,944,056 B2 | * | 9/2005 | Matsuzaki et al. | 365/185.05 |
| 2003/0048689 A1 | * | 3/2003 | Kim | 365/230.06 |
| 2003/0063509 A1 | * | 4/2003 | Yamasaki | 365/201 |
| 2003/0072176 A1 | * | 4/2003 | Watanabe | 365/185.18 |
| 2005/0057970 A1 | * | 3/2005 | Ogura et al. | 365/185.23 |

* cited by examiner

*Primary Examiner*—Son L. Mai
(74) *Attorney, Agent, or Firm*—Marger Johnson & McCollom, P.C.

(57) ABSTRACT

A flash memory device includes a write driver for driving a data line according to data to be written in a flash memory cell during a program period, a sense amplifier circuit for sensing and amplifying the data stored in the flash memory cell during a program verify period, and an insulation circuit for electrically insulating the sense amplifier circuit from the data line during an operation period of the write driver.

29 Claims, 7 Drawing Sheets

FLASH MEMORY DEVICE

CROSS-REFERENCE TO RELATED APPLICATIONS

This application claims the priority of Korean Patent Application No. 2003-83553, filed Nov. 24, 2003 in the Korean Intellectual Property Office, the disclosure of which is incorporated herein by reference.

BACKGROUND OF THE INVENTION

1. Field of the Invention

The present invention relates to a memory device and, more particularly, to a flash memory device.

2. Description of Related Art

Generally, a semiconductor integrated circuit device performs internal operations using an externally supplied power supply voltage. Further, the semiconductor integrated circuit device generates a higher voltage than the externally supplied power voltage therein and performs the internal operations using the higher voltage. For example, in a semiconductor integrated circuit device using a higher voltage than 3.3 V, a MOS transistor of a circuit area operating with a power supply voltage (hereinafter referred to as "low voltage circuit area") has a breakdown voltage durable to a higher voltage generated therein. In this case, a circuit area operating with a high voltage (hereinafter referred to as "high voltage circuit area") may be directly connected to the low voltage circuit area. Although the high voltage circuit area is directly connected to the low voltage circuit area, the MOS transistor of the low voltage circuit area is not broken down by the high voltage from the high voltage circuit area. This is because the MOS transistor of the low voltage circuit area has a breakdown voltage durable to the high voltage.

As a power supply voltage drops and the integration density of semiconductor integrated circuit devices increases. MOS transistors of a low voltage circuit area includes a low voltage transistor that has a high current capacity and occupies a smaller area. Thus, breakdown voltages of the MOS transistors of the low voltage circuit area also drop. Particularly, in the case where the breakdown voltage of the low voltage transistor is lower than the high voltage used in the high voltage circuit area, the low voltage transistor of the low voltage circuit area may be broken down by the high voltage from the high voltage circuit area when the low voltage circuit area is directly connected to the high voltage circuit area.

SUMMARY OF THE INVENTION

A feature of the present invention is to provide a flash memory device for preventing a program failure caused by the breakdown of a low voltage transistor.

Another feature of the present invention is to provide for preventing a high voltage supplied to a bitline from dropping during a program operation.

According to an aspect of the present invention, a semiconductor integrated circuit device comprises a high voltage circuit, a low voltage circuit, an internal circuit, and a first insulation circuit. The high voltage circuit operates with a high voltage, and the low voltage circuit operates with a low voltage. The internal circuit is connected to the high and low voltage circuits through a signal line. The first insulation circuit is coupled between the signal line and the low voltage circuit to electrically insulate the low voltage circuit from the signal line during an operation period of the high voltage circuit. The first insulation circuit includes a MOS transistor having a breakdown voltage higher than the high voltage. A higher voltage than the high voltage is applied to a gate of the MOS transistor during an operation period of the low voltage circuit.

In an exemplary embodiment of the present invention, the semiconductor integrated circuit device further comprises a second insulation circuit that is coupled between the signal line and the high voltage circuit to electrically insulate the high voltage circuit from the signal line during the operation period of the low voltage circuit. The second insulation circuit includes a MOS transistor having a breakdown voltage higher than the high voltage. A higher voltage than the high voltage is applied to the gate of the MOS transistor during the operation period of the high voltage circuit.

According to another aspect of the present invention, a flash memory device comprises a flash memory cell, a bitline connected to the flash memory cell, a switch circuit for connecting the bitline to a data line, a write driver for driving the bitline with a high voltage according to data to be stored in the flash memory cell, a sense amplifier circuit for sensing data stored in the flash memory cell through the bitline, and a first insulation circuit for insulating the sense amplifier circuit from the data line during an operation period of the write driver. The write driver is connected to the data line, and the sense amplifier circuit being connected to the data line. The first insulation circuit includes an NMOS transistor having a breakdown voltage higher than the high voltage. A higher voltage than the high voltage is applied to a gate of the NMOS transistor during an operation period of the write driver. The voltage applied to the gate of the NMOS transistor is a program voltage.

In this embodiment, the flash memory device further comprises a second insulation circuit for insulating the write driver from the data line during an operation period of the sense amplifier circuit. The second insulation circuit includes a NMOS transistor having a breakdown voltage higher than the high voltage. A higher voltage than the high voltage is applied to a gate of the NMOS transistor during an operation period of the sense amplifier circuit. The voltage applied to the gate of the NMOS transistor is a program voltage.

According to still another aspect of the present invention, a flash memory device comprises sectors each including local bitlines, a column selection circuit for selecting one of the sectors to connect bitlines of the selected sector to corresponding global bitlines respectively, a first switch circuit for connecting the global bitlines to data lines during program operation, a write driver circuit for driving the data lines with a high voltage according to data to be stored in the selected sector during the program operation, a sense amplifier circuit for sensing data stored in the selected sector through the data lines and the selected bitlines during a program verify operation, a second switch circuit coupled between the data lines and the sense amplifier circuit, and a control circuit for controlling the second switch circuit to insulate the sense amplifier circuit from the data lines during the program operation. Flash memory cells are connected in parallel to the respective local bitlines.

In this embodiment, the second switch circuit includes NMOS transistors each being coupled between the data lines and the sense amplifier circuit and each of the NMOS transistors has a breakdown voltage higher than the high voltage.

In this embodiment, a higher voltage than the high voltage is applied to gates of the NMOS transistors during the program verify operation. The voltage applied to the gate of the respective NMOS transistors is a program voltage.

In this embodiment, the flash memory device further comprises a third switch circuit coupled between the data lines and the write driver circuit. The control circuit controls the third switch circuit to insulate the write driver circuit from the data lines during the program verify operation. The third switch circuit includes NMOS transistors coupled between the data lines and the write driver circuit and each of the NMOS transistors has a breakdown voltage high voltage.

According to further another aspect of the present invention, a flash memory device comprises sectors each including local bitlines, a column selection circuit for selecting one of the sectors to connect bitlines of the selected sector to corresponding global bitlines respectively, a first switch circuit for connecting the global bitlines to first data lines during a program operation, a second switch circuit for connecting the global bitlines to second data lines during a read operation, a write driver circuit for driving the data lines with a high voltage according to data to be stored in the selected sector during the program operation, a first sense amplifier circuit for sensing data stored in the selected sector through the first data lines and the selected bitlines during a program verify operation, a second sense amplifier circuit for sensing data stored in the selected sector through the second data lines and the selected bitlines during the read operation, a third switch circuit coupled between the data lines and the sense amplifier circuit, and a control circuit for controlling the third switch circuit to insulate the sense amplifier circuit from the first data lines during the program operation and controlling the fourth switch circuit to insulate the write driver from the first data lines during the program verify operation. Flash memory cells are connected in parallel to the respective local bitlines.

BRIEF DESCRIPTION OF THE DRAWINGS

These and other objects and features of the present invention will become clear from the following description, taken in conjunction with the preferred embodiments with reference to the accompanying drawings in which.

DETAILED DESCRIPTION OF THE INVENTION

Figure 1:
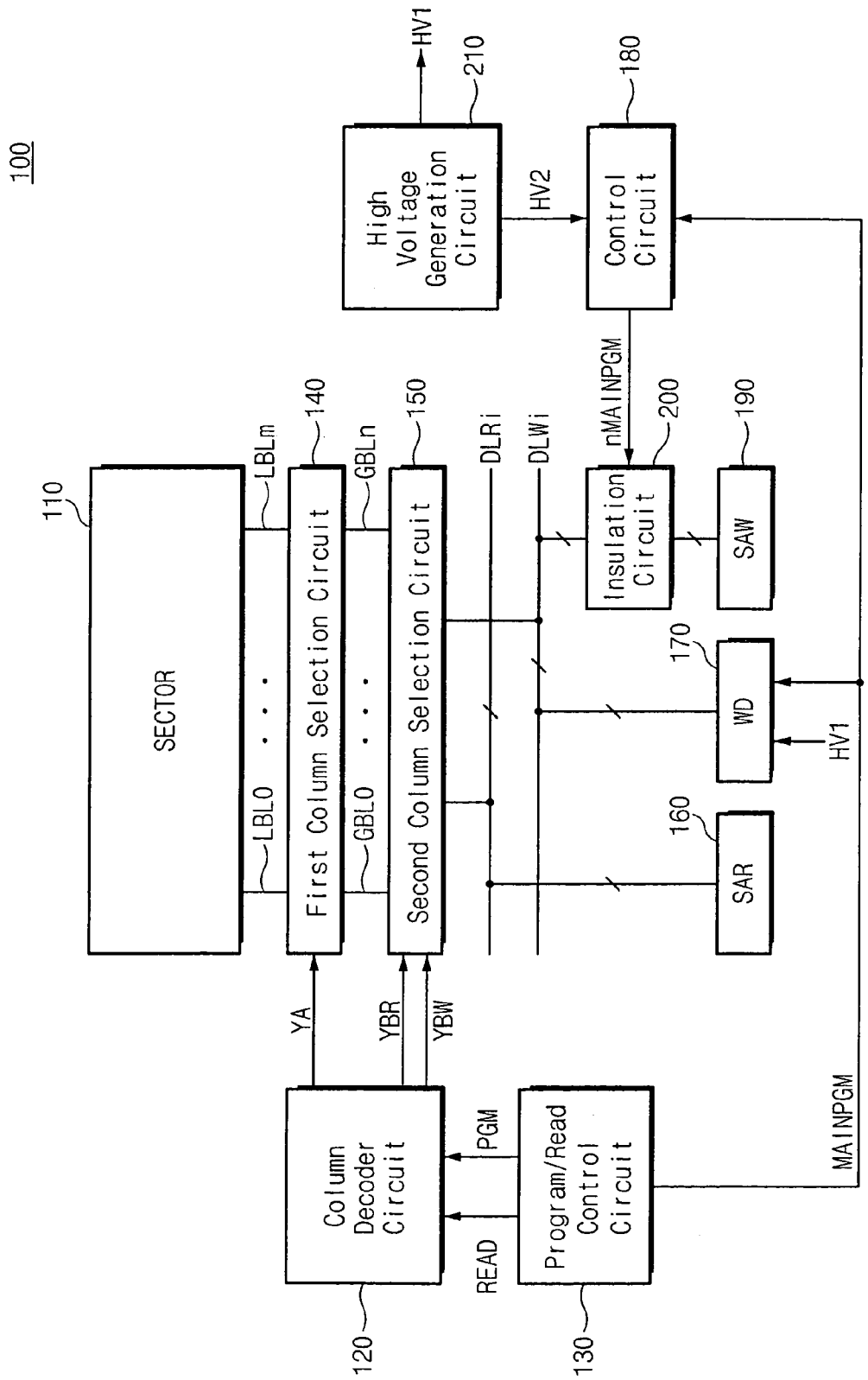
FIG. 1 is a block diagram of a flash memory device according to a first embodiment of the present invention.

Referring to FIG. 1, a flash memory device 100 according to the present invention includes a sector 10 for storing data information therein. A plurality of bitlines (or local bitlines) LBL0-LBLm are connected to the sector 10. A plurality of flash memory cells (not shown) are connected in parallel to the respective bitlines. Each of the flash memory cells includes a floating gate transistor having a control gate, a floating gate, a source, and a drain. It will be understood that the flash memory device 100 is a NOR flash memory device but the spirit of the present invention is not limited thereto. A column decoder circuit 120 receives a column address and generates column selection signals YA, YBR, and YBW in response to flag signals READ and PGM from a program/read control circuit 130. For example, the column decoder circuit 120 generates the column selection signals YA based on an inputted column address irrespective of the flag signal READ and PGM during a program/read operation. On the other hand, the column decoder circuit 130 generates the column selection signals YBR in response to activation of the flash signal READ (or during a read operation). The column decoder circuit 120 generates the column selection signals YBW in response to activation of the flag signal PGM (or during a program operation).

A column selection circuit 140 selects a part of the bitlines LBI0-LBLm in response to the column selecting signals YA from the column decoder circuit 120 and connects the selected bitlines to global bitlines GBL0-GBLn, respectively. A column selection circuit 150 selects a part of the global bitlines GBL0-GBLn in response to the column selection signals YBR outputted from the column decoder circuit 120 and connects the selected global bitlines to corresponding data lines DLRi, respectively. The column selection circuit 150 selects a part of the global bitlines GBL0-GBLn in response to the column selection signals YBW outputted from the column decoder circuit 120 and connects the selected global bitlines to corresponding data lines DLWi, respectively. Namely, the column selection circuit 150 connects the data lines DLRi to the selected global bitlines during the read operation and connects the data lines DLWi to the selected global bitlines during the program operation. In this embodiment, the data lines DLRi are used in the read operation and the data lines DLWi is used in the program operation.

A sense amplifier circuit (SAR) 160 is connected to the data lines DLRi and includes sense amplifiers each corresponding to the data lines DLRi. The sense amplifier 160 senses data from flash memory cells of the selected local through the column selection circuits 140 and 150 during a read operation. In this embodiment, the sense amplifier circuit 160 operates only during the read operation. A write driver circuit (WD) 170 includes a plurality of write drivers that are connected to the data lines DLRi, respectively. The write driver circuit 170 operates in response to a main program signal MAINPGM from the program/read control circuit 130 and drives the data lines DLWi with a high voltage/ground voltage according to data to be stored in the sector 110. It is well known that in a NAND flash memory device, a program operation is performed through program cycles which include a program period and a program verify period, respectively. In this case, the main program signal MAINPGM indicates a program period of each program cycle.

Figure 2:
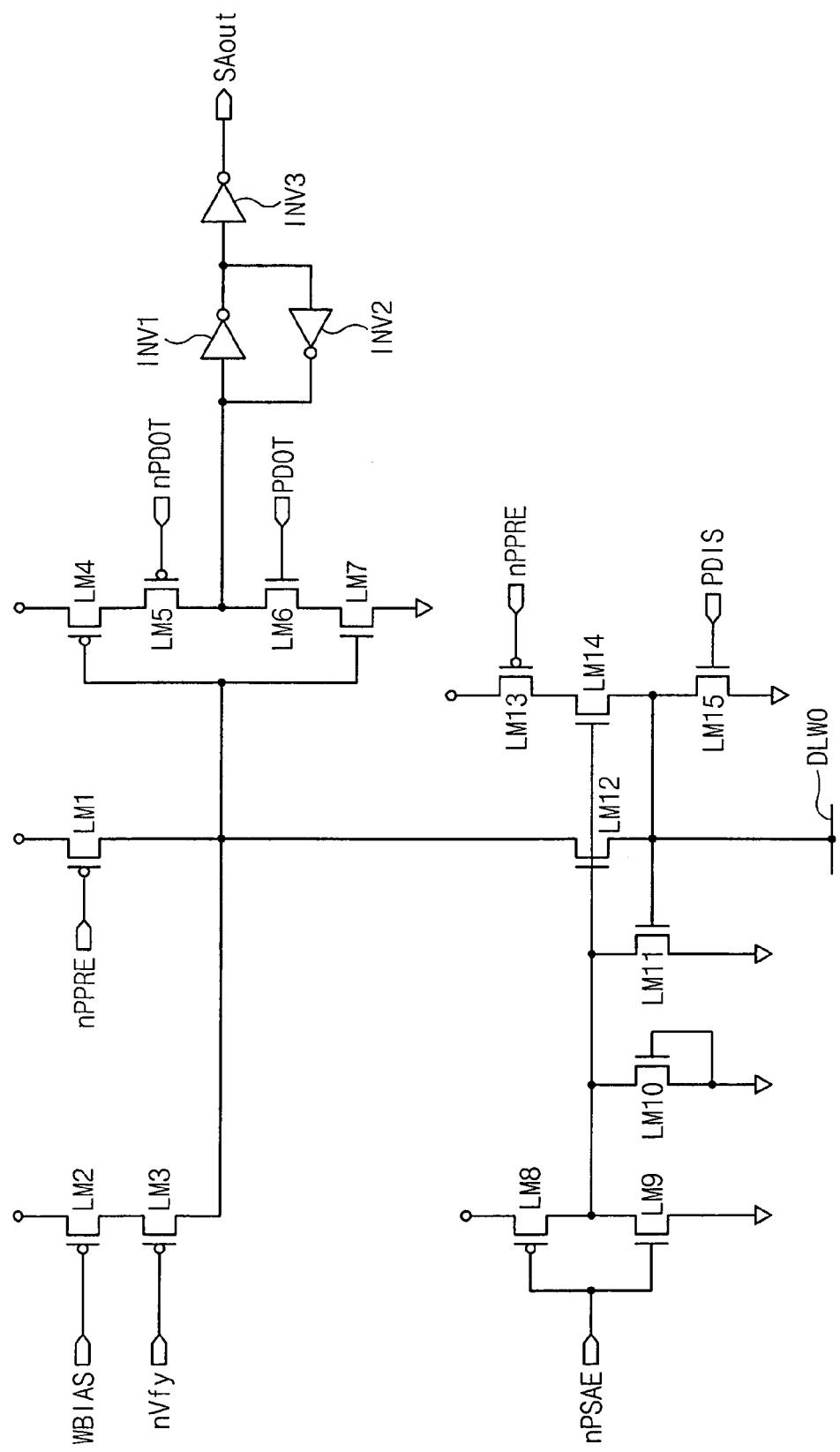
FIG. 2 is a circuit diagram of a sense amplifier circuit shown in FIG. 1.

The flash memory device 100 further includes a control circuit 180, a sense amplifier circuit (SAW) 190, and an insulation circuit 200. The control circuit 180 controls the insulation circuit 200 such that the sense amplifier circuit 190 is electrically insulated from the data lines DLWi during an operation period of the write driver circuit 170. The sense amplifier circuit 190 includes sense amplifiers each corresponding to the data lines DLRi and is used only during the program verify operation. A preferred embodiment of the sense amplifier circuit 190 is illustrated in FIG. 2. Since a layout area of the sense amplifier circuit 190 is large, the sense amplifier circuit 190 includes low voltage transistors that have a high current capacity and occupy a small area. The low voltage transistors are transistors each having a low breakdown voltage (e.g., 4V or lower).

Returning to FIG. 1, the control circuit 180 generates a control signal nMAINPGM in response to from the program/read control circuit 130. For example, when a main program signal MAINPGM is activated, i.e., during an operation period (or program period) of the write driver circuit 170, the control circuit 180 generates the control signal nMAINPGM to deactivate the insulation circuit 200. That is, the sense amplifier circuit 190 is electrically insulated from the data lines DLWi during a non-operation period (or program verify period) of the write driver circuit 170. In this embodiment, when the main program signal MAINPGM is deactivated, the control signal nMAINPGM has a high voltage HV2 from a high voltage generation circuit 210.

In brief, when the write driver circuit 170 operates, the data lines DLWi is driven with a high voltage HV1 (e.g., 5-6V) according to data to be written. In the case where the insulation circuit 200 does not exist, the high voltage applied to the data lines DLWi is directly applied to the sense amplifier circuit 190 acting as a low voltage circuit operating with a low voltage. That is, since the write driver circuit 170 and the sense amplifier circuit 190 share the data lines DLWi, MOS transistors (e.g., LM11, LM12, and LM15 of FIG. 2) constituting the sense amplifier circuit 190 is broken down by the high voltage IIV1 applied to the data lines DLWi. Thus the high voltage IIV1 applied to the data lines DLWi drops through the broken-down transistors of the high voltage IIV1 applied to the data lines DLWi, which results in failure of the program operation.

But in the case where the insulation circuit 200 is constructed between the data lines DLWi and the sense amplifier circuit 190, the foregoing problem may be solved. Namely, the insulation circuit 200 is controlled by the control circuit 180 such that the sense amplifier circuit 190 is electrically insulated from the data lines DLWi during the operation period of the write driver circuit 170. This means that the high voltage HV1 on the data lines DLWi is not applied to the sense amplifier circuit 190 during the operation period (or program period) of the write driver circuit 170. Therefore, it is possible to prevent a high voltage from dropping through a sense amplifier circuit due to the breakdown of a low voltage transistor. As a result, a program operation may be normally carried out.

Figure 3:
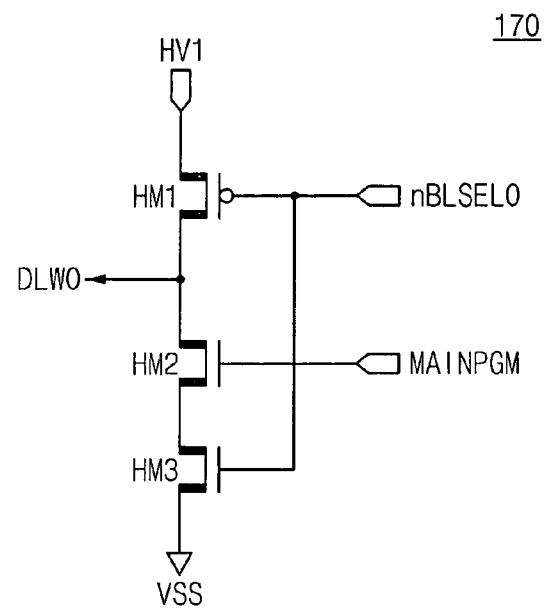
FIG. 3 is a circuit diagram of a write driver circuit shown in FIG. 1.

FIG. 3 is a circuit diagram of the write driver circuit shown in FIG. 1. Although a write driver connected to only one data line (e.g., DLW0) is illustrated in FIG. 3, write drivers respectively connected to the other data lines have the same configuration as shown in FIG. 3.

Referring to FIG. 3, the write driver circuit 170 includes a PMOS transistor HM1 and NMOS transistors HM2 and HM3. The PMOS transistor HM1 is coupled between a high voltage HV1 and a data line DLW0 and is controlled by a data signal nBLSEL0. The NMOS transistors HM2 and HM3 are serially coupled between the data line DWL0 and a ground voltage VSS. The NMOS transistor HM2 is controlled by a main program signal MAINPGM, and the NMOS transistor HM3 is controlled by a data signal nBLSEL0. The data signal nBLSEL0 indicates data to be programmed, and the main program MAINPGM indicates a program period.

In this embodiment, the MOS transistors HM1, HM2, and HM3 constituting the write driver circuit 170 are high voltage transistors each having a breakdown voltage (e.g., 9V or higher) higher than the high voltage HV1.

In a circuit operation, the data line DLW0 is maintained in a floating state while the program operation is not performed (i.e., when the main program signal MAINPGM is low). When the program operation is performed (i.e., the main program signal MAINPGM is high), the data line DLW0 is driven with the high voltage HV1 or the ground voltage VSS according to the data signal nBLSEL0. For example, when the data signal nBLSEL0 is low, the write driver circuit 170 supplies the high voltage HV1 to the data line DLW0. When the data signal nBLSEL0 is high, the write driver circuit 170 supplies the ground voltage VSS to the data line DLW0.

Figure 4:
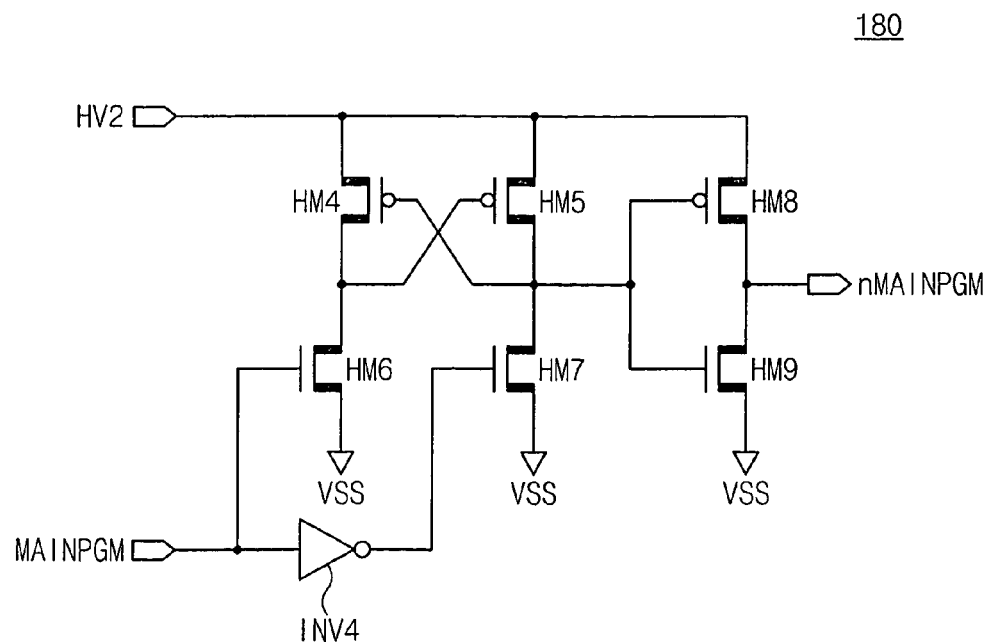
FIG. 4 is a circuit diagram of a control circuit shown in FIG. 1.

Referring to FIG. 4, the control circuit 180 outputs a control signal nMAINPGM of the ground voltage VSS when the main program signal MAINPGM is high. The control circuit 180 outputs a control signal nMAINPGM of a high voltage HV2 when a main program signal MAINPGM is low. The control circuit 180 includes PMOS transistors HM4, HM5, and HM8, MOS transistors HM6, HM7, and HM9, and an inverter INV4, which are connected as shown in this figure. The control circuit 180 acts as a level shifter, and the MOS transistors HM4-HM9 are high voltage transistors each having a breakdown voltage (e.g., 9V or higher) higher than a high voltage HV1. The high voltage HV2 is supplied from the high voltage generation circuit 210, as shown in FIG. 1, and is a voltage supplied to a wordline or higher voltage therethan during a program operation.

Figure 5:
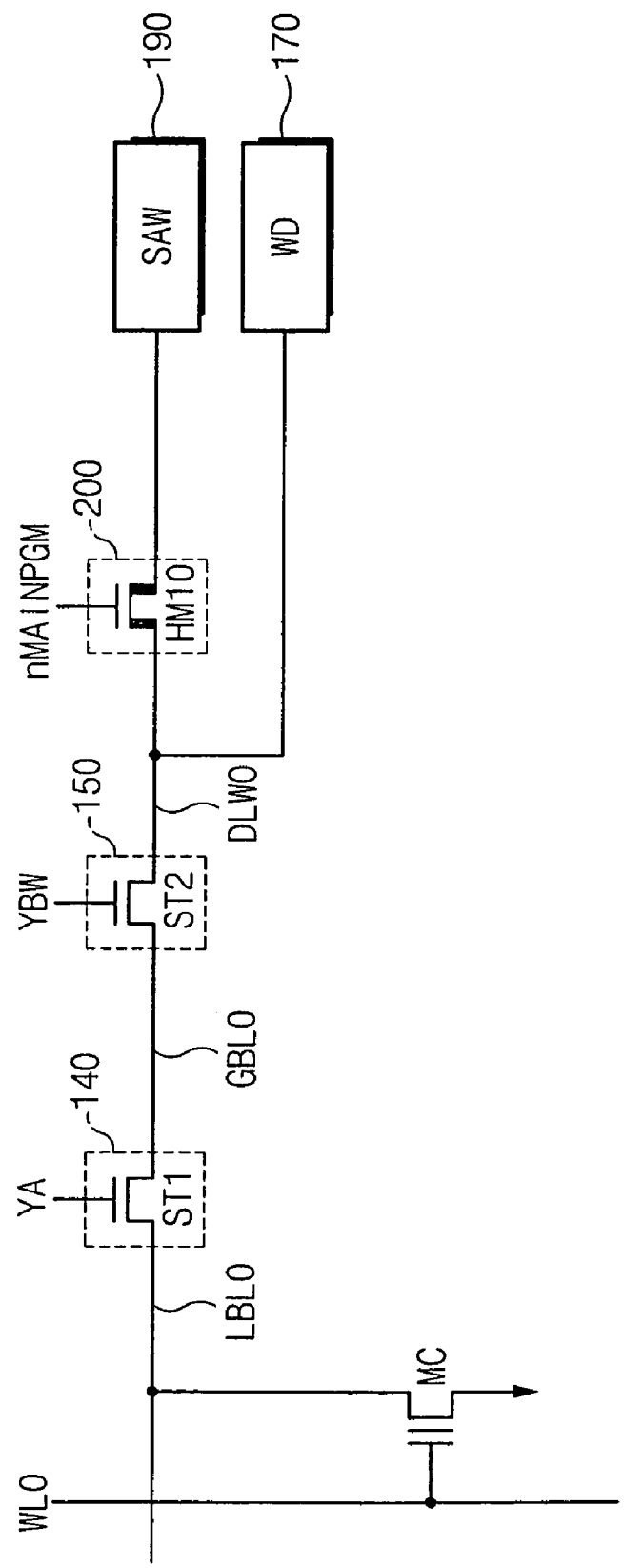
FIG. 5 is a circuit diagram of an insulation circuit and a column selection circuit shown in FIG. 1.

FIG. 5 is a circuit diagram of the insulation circuit and the row column selection circuit shown in FIG. 1. Referring to FIG. 5, in the insulation circuit 200, an NMOS transistor HM10 connected to only one data line DLW0 is illustrated. The NMOS transistor HM10 of the insulation circuit 200 is coupled between the data line DLW0 and a sense amplifier circuit 190 and is controlled by a control signal nMAINPGM from a control circuit 180. The NMOS transistor HM10 is a high voltage transistor having a breakdown voltage (e.g., 9V or higher) higher than a high voltage HV1. The data line DLW0 is connected to a local bitline LBL0 through NMOS transistors ST1 and ST2 when column selection signals YA and YBW are activated.

When the control signal nMAINPGM has a low level of a ground voltage or during an operation period of the write driver circuit 170, the NMOS transistor HM10 of the insulation circuit 200 is turned off to electrically insulate the sense amplifier circuit 190 from the data line DWL0. During the operation period of the write driver circuit 170 (or while the program operation is performed), the sense amplifier circuit 190 is electrically insulated from the data lines DLW0. Therefore, it is possible to prevent MOS transistors of the sense amplifier circuit 190 (e.g., MOS transistors LM11, LM12, and LM15 of FIG. 2) from being broken down by a high voltage of the data line DLW0. As a result, the program failure caused by reduction of the high voltage of the data line DLW0 may be prevented. When the control signal nMAINPGM has a high level of the high voltage HV2 or during a non-operation period (program verify period) of the write driver circuit 170, the NMOS transistor HM10 of the insulation circuit 200 is turned on. Thus, the sense amplifier circuit 190 senses a voltage (or cell current) of the data line DLW0 connected to a flash memory cell MC through NMOS transistors ST1 and ST2.

Figure 6:
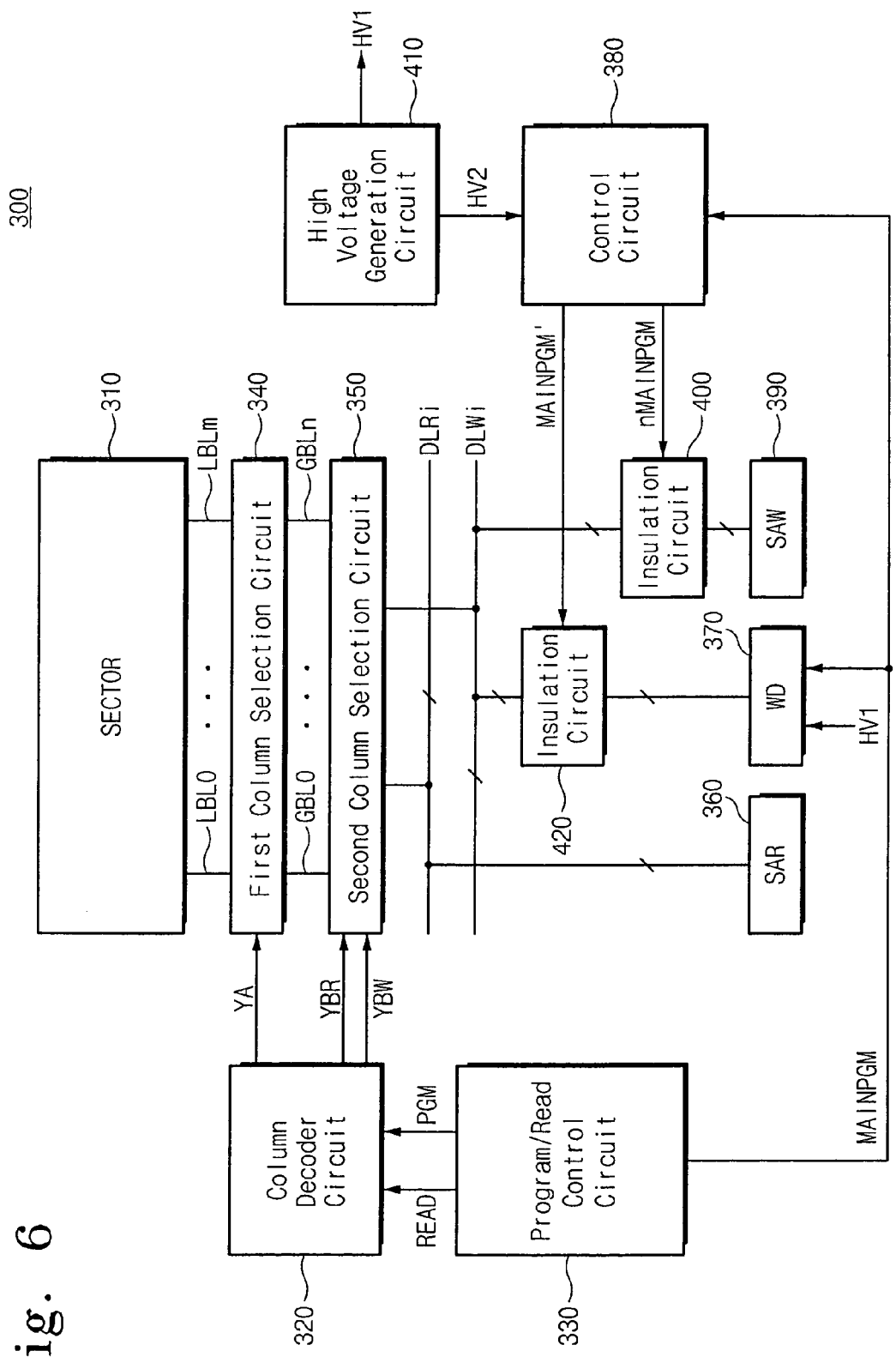
FIG. 6 is a block diagram of a flash memory device according to a second embodiment of the present invention.

A flash memory 300 device according to a second embodiment of the present invention is illustrated in FIG. 6.

Referring to FIG. 6, the flash memory 300 is substantially identical to the flash memory device 100 shown in FIG. 1 except that the flash memory device 300 further includes an insulation circuit 420. The insulation circuit 420 electrically insulates a write driver circuit 370 from data lines DLWi in response to a control signal MAINPGM' from a control circuit 380, which means that input loading of the sense amplifier circuit 390 is reduced. Thus the sense amplifier circuit 300 performs a sensing operation at a higher speed.

Figure 7:
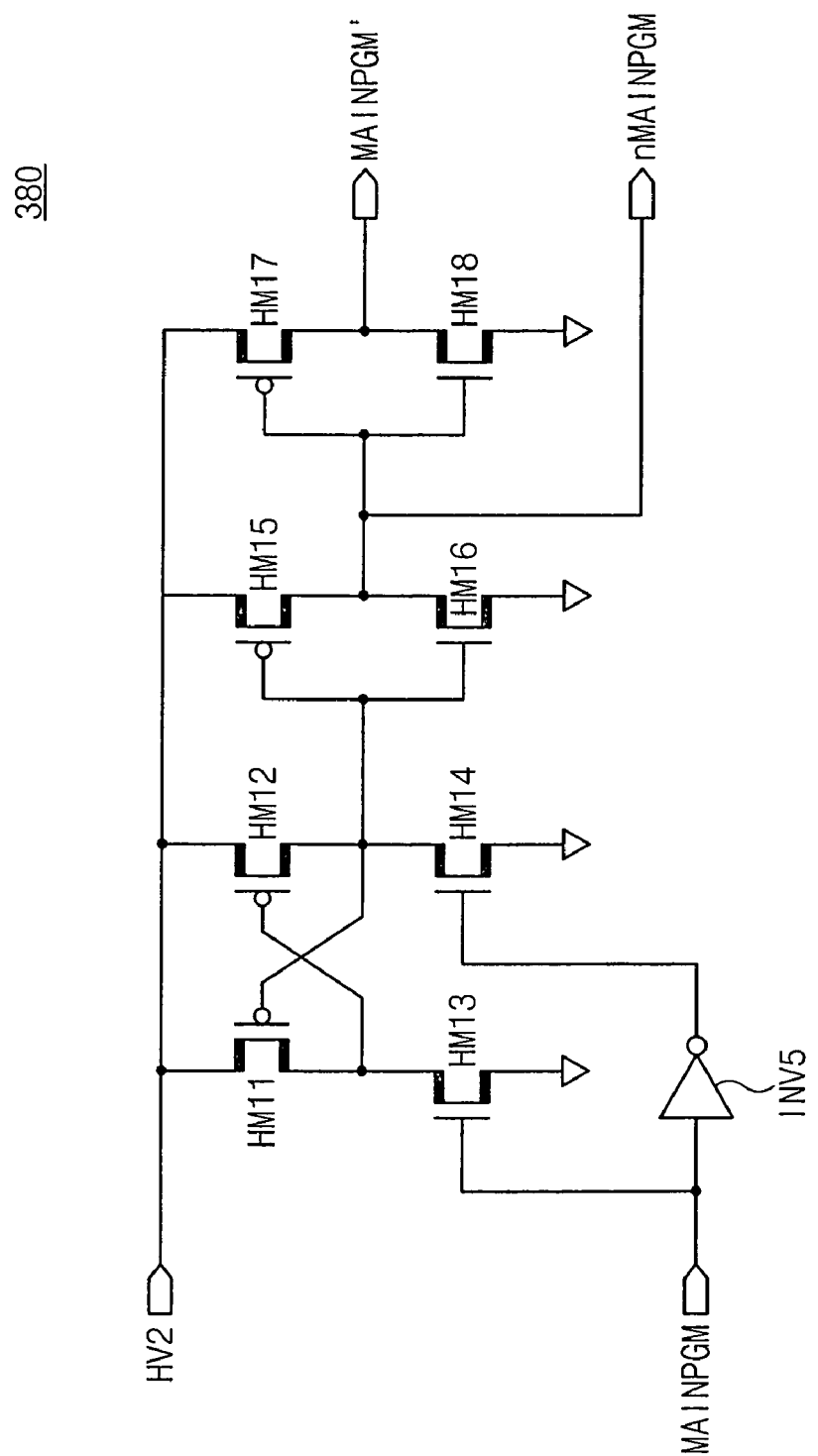
FIG. 7 is a circuit diagram of a control circuit shown in FIG. 6.

Referring to FIG. 7, the control circuit 380 outputs a control signal nMAINPGM of a ground voltage VSS and a control signal MAINPGM' of a high voltage HV2 when a main program signal MAINPGM is high. The control circuit 380 outputs a control signal nMAINPGM of the high voltage HV2 and a control signal MAINPGM' of the ground voltage VSS when the main program signal MAINPGM is low. The control signal includes PMOS transistors HM11, HM12, HM15, and HM17, NMOS transistors HM13, HM14, HM16, and HM18, and an inverter INV5, which are connected as shown this figure. The control circuit acts as a level shifter, and the MOS transistors HM11-HM18 are high voltage transistors each having a breakdown voltage (e.g., 9V or higher) higher than the high voltage HV1.

Figure 8:
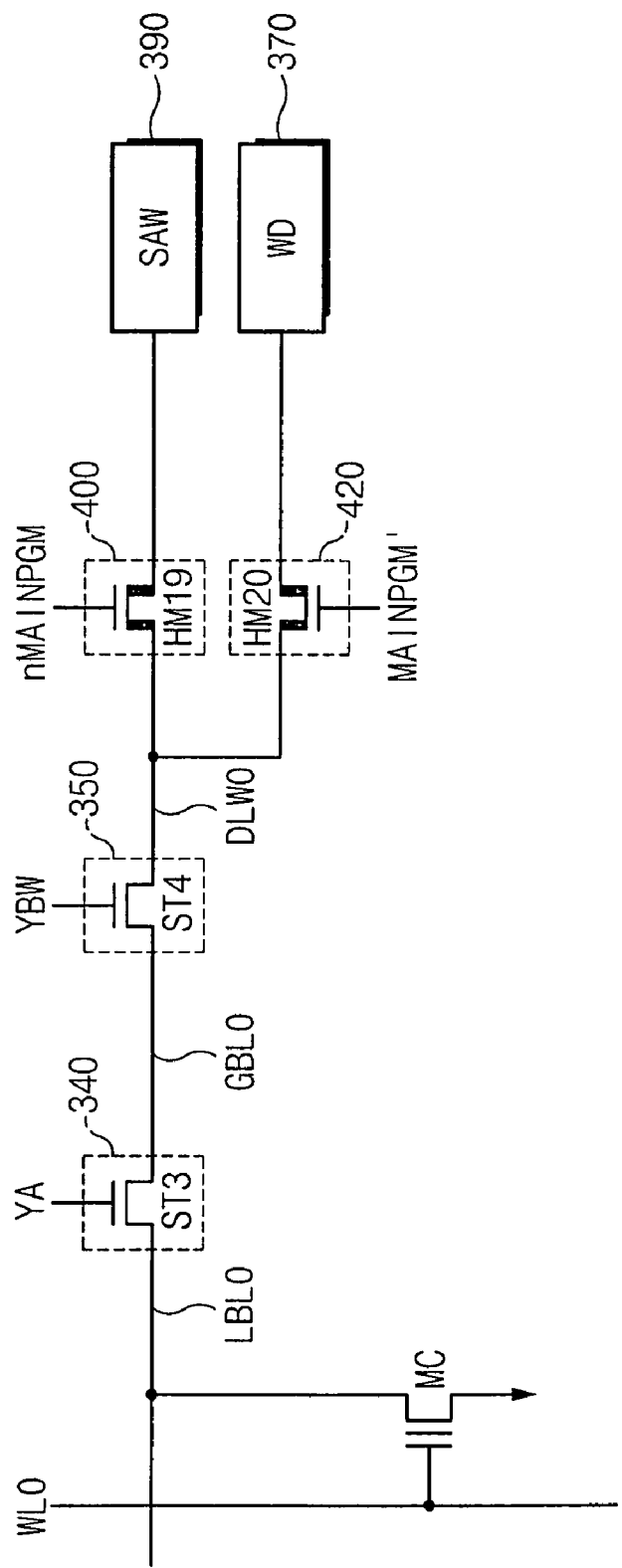
FIG. 8 is a circuit diagram of insulation circuits and column selection circuits shown in FIG. 6.

Referring to FIG. 8, an NMOS transistor HM19 of the insulation circuit 400 is coupled between a data line DLW0 and a sense amplifier circuit 390 and is controlled by a control signal nMAINPGM from the control circuit 380. An NMOS transistor HM20 of the insulation circuit 420 is coupled between the data line DLW0 and a write driver circuit 370 and is controlled by a control signal MAINPGM' from a control circuit 380. The NMOS transistors are high voltage transistors each having a breakdown voltage (e.g., 9V or higher) higher than a high voltage HV1. The data line DLW0 is connected to a local bitline LBL0 through the NMOS transistors ST3 and ST4 when column selection signals YA and YBW.

During an operation period of the write driver circuit 370, i.e., when the control signal nMAINPGM has a low level of a ground voltage and the control signal MAINPGM' has a high level of a high voltage HV2, the NMOS transistor HM19 of the insulation circuit 400 is turned off and the NMOS transistor HM20 of the insulation circuit 420 is turned on. As the NMOS transistor HM20 is turned on, the write driver circuit 370 drives the data line DLW0 with the high voltage HV1 or a ground voltage VSS according to data to be programmed. On the contrary, as the NMOS transistor HM19 is turned off, the sense amplifier circuit 390 is electrically insulated from the data line DLW0. During the operation period of the write driver circuit 370 (or while the program operation is performed), the sense amplifier circuit 390 is electrically insulated from the data line DLW0. Therefore, it is possible to prevent the MOS transistor of the sense amplifier circuit 390 (e.g., MOS transistor LM11, LM12, and LM15 of FIG. 2) from being broken down by a high voltage of the data line DLW0. As a result, a program failure caused by reduction of the high voltage of the data line DLW0 may be prevented.

During the operation period of the sense amplifier circuit 390, i.e., when the control signal MAINPGM' has a low level of a ground voltage and the control signal nMAINPGM has a high level of the high voltage HV2, the NMOS transistor HM19 of the insulation circuit 400 is turned on and the NMOS transistor HM20 of he insulation circuit 420 is turned off. As the NMOS transistor HM19 is turned on, the write driver circuit 370 is electrically insulated form the data line DLW0. During the operation period of the sense amplifier circuit 390 (while a program verify operation is performed), the write driver circuit 370 is electrically insulated from the data line DLW0. Therefore, input loading of the sense amplifier circuit 390 is reduced to enable the sense amplifier circuit 390 to perform a sensing operation at a high speed.

According to the present invention, a sense amplifier circuit for verifying a program constitutes a low voltage circuit operating with a low voltage, and a write driver circuit constitutes a high voltage circuit operating with a high voltage.

As explained so far, when a write driver circuit operates, a sense amplifier circuit for verifying a program is electrically insulated from a data line to prevent MOS transistors of the sense amplifier circuit from being broken down by a high voltage of a data line. Thus, a program failure caused by drop in a high voltage can be prevented. When the sense amplifier circuit operates, the write driver circuit is electrically insulated to reduce the loading applied to the sense amplifier circuit. Thus, the operation speed of the sense amplifier circuit can be enhanced.

Although specific embodiments have been illustrated and described herein, it will appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A semiconductor integrated circuit device comprising:
   a high voltage circuit operating with a high voltage;
   a low voltage circuit operating with a low voltage;
   an internal circuit connected to the high and low voltage circuits through a signal line; and
   a first isolation circuit for electrically isolating the low voltage circuit from the signal line during an operation period of the high voltage circuit, the first isolation circuit being coupled between the signal line and the low voltage circuit, wherein the first isolation circuit includes a MOS transistor having a breakdown voltage higher than the high voltage.

2. The semiconductor integrated circuit device of claim 1, wherein a higher voltage than the high voltage is applied to a gate of the MOS transistor during an operation period of the low voltage circuit.

3. A semiconductor integrated circuit device comprising:
   a high voltage circuit operating with a high voltage;
   a low voltage circuit operating with a low voltage;
   an internal circuit connected to the high and low voltage circuits through a signal line;
   a first isolation circuit for electrically isolating the low voltage circuit from the signal line during an operation period of the high voltage circuit, the first isolation circuit being coupled between the signal line and the low voltage circuit; and
   a second isolation circuit for electrically isolating the high voltage circuit from the signal line, the second isolation circuit being coupled between the signal line and the high voltage circuit, wherein the second isolation circuit includes a MOS transistor having a breakdown voltage higher than the high voltage.

4. The semiconductor integrated circuit device of claim 3, wherein a higher voltage than the high voltage is applied to a gate of the MOS transistor during an operation period of the high voltage circuit.

5. A flash memory device comprising:
a flash memory cell;
a bit line connected to the flash memory cell;
a switch circuit for connecting the bit line to a data line;
a write driver for driving the bit line with a high voltage according to data to be stored in the flash memory cell, the write driver being connected to the data line;
a sense amplifier circuit for sensing data stored in the flash memory cell through the bit line, the sense amplifier circuit being connected to the data line; and
a first isolation circuit for isolating the sense amplifier circuit from the data line during an operation period of the write driver.

6. The flash memory device of claim 5, wherein the first isolation circuit includes an NMOS transistor having a breakdown voltage higher than the high voltage.

7. The flash memory device of claim 6, wherein a higher voltage than the high voltage is applied to a gate of the NMOS during an operation period of the sense amplifier circuit.

8. The flash memory device of claim 7, wherein the higher voltage applied to the gate of the NMOS transistor is a program voltage.

9. The flash memory device of claim 5, further comprising a second isolation circuit for isolating the write driver from the data line during an operation period of the sense amplifier circuit.

10. The flash memory device of claim 9, wherein the second isolation circuit includes an NMOS transistor having a breakdown voltage higher than the high voltage.

11. The flash memory device of claim 10, wherein a higher voltage than the high voltage is applied to a gate of the NMOS transistor during an operation period of the write driver.

12. The flash memory device of claim 11, wherein the higher voltage applied to the gate of the NMOS transistor is a program voltage.

13. A flash memory device comprising:
sectors each including local bit lines, wherein flash memory cells are connected in parallel to the respective local bit lines;
a column selection circuit for selecting one of the sectors to connect bit lines of the selected sector to corresponding global bit lines respectively;
a first switch circuit for connecting the global bit lines to data lines during a program operation;
a write driver circuit for driving the data lines with a high voltage according to data to be stored in the selected sector during the program operation;
a sense amplifier circuit for sensing data stored in the selected sector through the data lines and the selected bit lines during a program verify operation;
a second switch circuit coupled between the data lines and the sense amplifier circuit; and
a control circuit for controlling the second switch circuit to isolate the sense amplifier circuit from the data lines during the program operation.

14. The flash memory device of claim 13, wherein the second switch circuit includes NMOS transistors each being coupled between the data lines and the sense amplifier circuit and each of the NMOS transistors has a breakdown voltage higher than the high voltage.

15. The flash memory device of claim 14, wherein a higher voltage than the high voltage is applied to gates of the NMOS transistors during the program verify operation.

16. The flash memory device of claim 15, wherein the higher voltage applied to the gates of the respective NMOS transistors is a program voltage.

17. The flash memory device of claim 13, further comprising a third switch circuit coupled between the data lines and the write driver circuit, wherein the control circuit controls the third switch circuit to isolate the write driver circuit from the data lines during the program verify operation.

18. The flash memory of claim 17, wherein the third switch circuit includes NMOS transistors coupled between the data lines and the write driver circuit and each of the NMOS transistors has a breakdown voltage higher than the high voltage.

19. The flash memory device of claim 18, wherein a higher voltage than the high voltage is applied to gates of the NMOS transistors during the program operation.

20. The flash memory device of claim 19, wherein the higher voltage applied to the gates of the respective NMOS transistors is a program voltage.

21. A flash memory device comprising:
sectors each including local bit lines, wherein flash memory cells are connected in parallel to the respective local bit lines;
a column selection circuit for selecting one of the sectors to connect bit lines of the selected sector to corresponding global bit lines respectively;
a first switch circuit that is operable in a first mode to connect the global bit lines to first data lines during a program operation and in a second mode to connect the global bit lines to second data lines during a read operation;
a write driver circuit for driving the first data lines with a high voltage according to data to be stored in the selected sector during the program operation;
a first sense amplifier circuit for sensing data stored in the selected sector through the first data lines and the selected bit lines during a program verify operation;
a second sense amplifier circuit for sensing data stored in the selected sector through the second data lines and the selected bit lines during the read operation;
a second switch circuit coupled between the first data lines and the first sense amplifier circuit; and
a control circuit for controlling the second switch circuit to isolate the first sense amplifier circuit from the first data lines during the program operation and controlling a third switch circuit to isolate the write driver from the first data lines during the program verify operation.

22. The flash memory device of claim 21, wherein the second switch circuit includes NMOS transistors coupled between the first data lines and the first sense amplifier circuit and each of the NMOS transistors has a breakdown voltage higher than the high voltage.

23. The flash memory device of claim 22, wherein a higher voltage than the high voltage is applied to gates of the NMOS transistors during the program verify operation.

24. The flash memory device of claim 21, wherein the third switch circuit includes NMOS transistors coupled between the first data lines and the write driver circuit and each of the NMOS transistors has a breakdown voltage higher than the high voltage.

25. The flash memory device of claim 24, wherein a higher voltage than the high voltage is applied to gates of the NMOS transistors during the program operation.

26. The flash memory device of claim 23, wherein the higher voltage applied to the gate of the respective NMOS transistors is a program voltage.

27. The flash memory device of claim 25, wherein the higher voltage applied to the gate of the respective NMOS transistors is a program voltage.

28. The flash memory device of claim 6, wherein a low level of a ground voltage is applied to a gate of the NMOS transistor during an operation of the write driver.

29. The flash memory device of claim 10, wherein a low level of a ground voltage is applied to a gate of the NMOS transistor during an operation of the sense amplifier circuit.

* * * * *